United States Patent [19]

Kishida

[11] Patent Number: 4,941,033
[45] Date of Patent: Jul. 10, 1990

[54] SEMICONDUCTOR INTEGRATED CIRCUIT DEVICE

[75] Inventor: Satoru Kishida, Itami, Japan

[73] Assignee: Mitsubishi Denki Kabushiki Kaisha, Japan

[21] Appl. No.: 328,539

[22] Filed: Mar. 24, 1989

[30] Foreign Application Priority Data

Dec. 27, 1988 [JP] Japan .................. 63-327609

[51] Int. Cl.$^5$ .............. H01L 23/12; H01L 23/14; H01L 23/04
[52] U.S. Cl. ............................. 357/75; 357/74; 357/80
[58] Field of Search ............ 357/80, 68, 74, 75, 357/81; 361/412, 413, 414, 415, 420

[56] References Cited

U.S. PATENT DOCUMENTS 4,721,995 1/1988 Tanizawa ...................... 357/75
4,744,008 5/1988 Black et al. ................... 357/75
4,855,867 8/1989 Gazdik et al. ................. 357/81

Primary Examiner—Rolf Hille
Assistant Examiner—S. V. Clark
Attorney, Agent, or Firm—Leydig, Voit & Mayer

[57] ABSTRACT

A semiconductor integrated circuit device of a multilayer type having a plurality of semiconductor chips. The device comprises a plurality of semiconductor chips each having a plurality of electrode pads, a plurality of wiring films which are arranged in correspondence with the semiconductor chips and on which the corresponding semiconductor chips are mounted, a plurality of first terminals provided in each of the wiring films and respectively connected to the plurality of electrode pads of the semiconductor chip corresponding to the wiring film, and a plurality of second terminals disposed beyond the first terminals of each wiring film and electrically connected to the respective first terminals.

17 Claims, 4 Drawing Sheets

SEMICONDUCTOR INTEGRATED CIRCUIT DEVICE

BACKGROUND OF THE INVENTION

1. Field of the Invention

This invention relates to a semiconductor integrated circuit device and, in particular, to a multi-layer device composed of a plurality of semiconductor chips.

2. Description of the Related Art

FIG. 8 is a perspective view of a conventional semiconductor device. The device shown comprises a package 81 and an LSI chip 82 contained therein. The LSI chip 82 has on its surface a multitude of electrode pads 83, the package 81 having a multitude of pins 84, each corresponding to an electrode pads 83. Each of the electrode pad 83 of the LSI chip 82 is electrically connected to the corresponding pin 84 through a wire 85.

In operation, the pins 84 are electrically connected to a circuit outside this semiconductor device so that input signals from an external circuit are transmitted through the pins 84 and the wires 85 to the electrode pads 83 of the LSI chip 82. On the other hand, output signals from the LSI chip 82 are output through the electrode pads 83, the wires 85 and the pins 84 to the external circuit.

When a plurality of LSI chips are used in a conventional semiconductor device constructed in this way, a plurality of packages 81 containing respective LSI chips 82 are arranged on a single substrate, and electrical connections between the packages 81 and between the semiconductor device and the external circuit are effected through the pins 84. As a result, the mounting of the packages 81 requires a large area, which leads to an increase in the size of the equipment in which such semiconductor devices are used.

Even if LSI chips 82 are used without being housed in packages 81, the problem of the large area required for their mounting will remain since a plurality of LSI chips 82 will then inevitably have to be arranged in one plane.

SUMMARY OF THE INVENTION

This invention has been conceived for the purpose of eliminating this problem. It is accordingly an object of this invention to provide a semiconductor integrated circuit device which can be mounted without occupying a large area even if it includes a plurality of semiconductor chips.

In accordance with this invention, there is provided a semiconductor integrated circuit device comprising: a plurality of semiconductor chips each having a plurality of electrode pads and arranged in a multi-layer structure; a plurality of wiring films arranged in correspondence with the semiconductor chips for the mounting the corresponding semiconductor chips; a plurality of first terminals provided in each of said wiring films and respectively connected to the plurality of electrode pads of the semiconductor chip corresponding to the wiring film; and a plurality of second terminals provided outside said first terminals of each wiring film and electrically connected to the corresponding first terminals.

DESCRIPTION OF THE PREFERRED EMBODIMENTS

Embodiments of this invention will now be described with reference to the attached drawings.

Figure 1A:
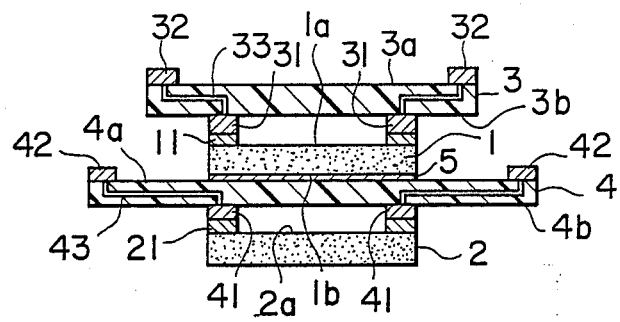
FIGS. 1A and 1B are a sectional view and a plan view, respectively, of a semiconductor integrated circuit device in accordance with a first embodiment of the invention.

The semiconductor integrated circuit device shown in FIG. 1A includes a first semiconductor chip 1 and a second semiconductor chip 2, the latter being disposed directly below the former. A plurality of electrode pads 11 and 21 are disposed peripherally on the respective upper surfaces 1a and 2a of the semiconductor chips 1 and 2. Arranged above the first semiconductor chip 1 is a first wiring film 3 having a larger area than the former. Further, a second wiring film 4 having a larger area than the first wiring film 3 is arranged between the first and second semiconductor chips 1 and 2.

A plurality of first terminals 31 are disposed on the lower surface 3b of the first wiring film 3, at positions corresponding to the electrode pads 11 of the first semiconductor chip 1. Each of the first terminals 31 is connected to the corresponding electrode pad 11 on the first semiconductor chip 1 by soldering or by means of a conductive adhesive. A plurality of second terminals 32 corresponding to the first terminals 31 are peripherally disposed on the upper surface 3a of the first wiring film 31, the corresponding first and second terminals 31 and 32 being electrically connected to each other through wiring 33 of the wiring film 3.

On the other hand, a plurality of first terminals 41 are formed on the lower surface 4b of the second wiring film 2, at positions corresponding to the electrode pads 21 of the semiconductor chip 2, each of the first terminals 41 being connected to a corresponding electrode pad 21 of the second semiconductor chip 2 by soldering or by means of a conductive adhesive. A plurality of second terminals 42 corresponding to the first terminals 41 are peripherally disposed on the upper surface 4a of the second wiring film 4, the corresponding first and second terminals 41 and 42 being connected to each other through the wiring 43 of the wiring film 4.

The lower surface 1b of the first semiconductor chip 1 is connected to the upper surface 4a of the second wiring film 4 by means of an adhesive material 5.

Figure 1B:
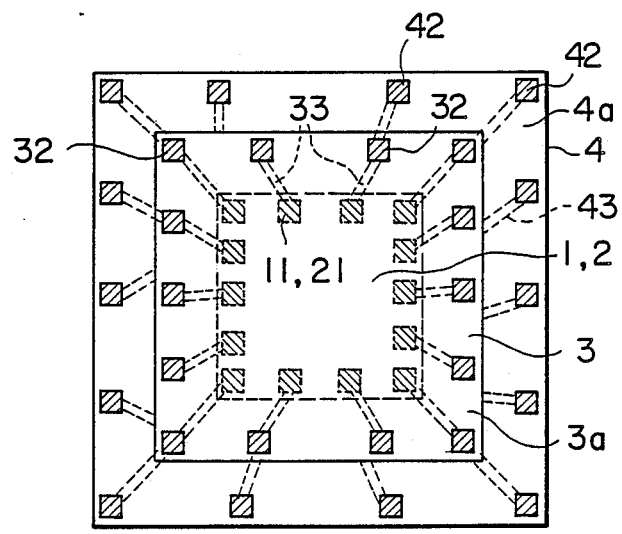

Since the second wiring film 4 has a larger area than the first wiring film 3, the second terminals 42 on the upper surface 4a of the second wiring film 4 are, as shown in FIG. 1B, situated beyond the second terminals 32 on the upper surface 3a of the first wiring film 3. The second terminals 32 and 42 of the first and second wiring films 3 and 4 form the external terminals of this semiconductor integrated circuit device.

The semiconductor integrated circuit device thus constructed is used with the second terminals 32 and 42 respectively formed on the first and second wiring films 3 and 4 connected to an external circuit or a substrate. Accordingly, a signal input from the external circuit, etc. to the second terminals 32 of the first wiring film 3 is transmitted through the wiring 33 and the first terminals 31 to the electrode pads 11 of the first semiconductor chip 1. On the other hand, a signal output from the electrode pads 11 of the first semiconductor chip 1 is transmitted through the first terminals 31, the wiring 33 and the second terminals 32 of the first wiring film 3 to an external circuit, etc. Likewise, the signals output from and input to the second semiconductor chip 2 are transmitted to and from the external circuit, etc., through the first terminals 41, the wiring 43 and the second terminals 42 of the second wiring film 4.

Figure 2A:
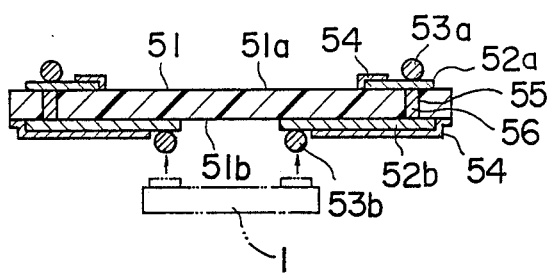
FIG. 2A is a sectional view showing the structure of the wiring film used in the first embodiment.

FIG. 2A shows an example of the structure of the first and second wiring films 3 and 4. The wiring film shown includes a film body 51 made of polyimide. Adhered to the lower surface 51b of the film body 51 is a copper foil 52b in a predetermined pattern. Solder bumps 53b serving as the first terminals are formed at edges of the copper foil 52b, the rest of the copper foil 52b being coated with a covering film 54 made of an electrically insulating material such as polyimide. Formed in the portions of the film body 51 at which the edges of the copper foil 52b opposite bumps 53b are situated are through-holes 55 extending from the upper surface 51a to the lower surface 51b of the film body 51. Plating metals 56 are embedded in the through-holes 55. Copper foil 52a is adhered to the upper surface 51a of, the film body 41, over the through-holes 55, and solder bumps 53a as the second terminals are disposed on the copper foil 52a. Thus, the bumps 53a, and 53b on the upper and lower sides of the film body 51, i.e., as the first and second terminals, are electrically connected to each other through the copper foil 52a, 52b and the plating metal 56.

Such a wiring film may be prepared in the following manner: first, through-holes 55 are formed using a punch or the like at the positions where the terminals are to protrude from the lower surface 51b of the film body 51 made of polyimide.

Next, copper foil 52a is adhered to the upper surface 51a of the film body 51 and is formed into a pattern utilizing photolithography and etching. The patterning must be so performed that those portions of the copper foil 52a which are situated over the through-holes 55 are not removed.

After that, the upper surface of the copper foil 52a on the upper surface 51a of the film body 51 is covered with a covering film 54 made of an electrically insulating material except for those portions of the copper foil 52a which are situated where the terminals are designed to protrude, metal plating being effected using the copper foil 52a as an electrode. Since the lower surface 51b of the film body 51 is not covered with a covering film 54, plating metal 56 accumulates on the lower surface of the copper foil 52a in the through-hole 55, the through-holes 55 being gradually filled with the plating metal 56 until the plating metal reaches the lower surface 51b of the film body 51.

Then, copper foil 52b is adhered to the lower surface 51b of the film body 51 and is patterned by photolithography and etching. Since the plating metal 56 reaches the lower surface 51b of the film body 51, the copper foil 52b adhered to the lower surface 51b and the plating metal 56 in the throughholes 55 are electrically connected to each other.

Finally, after covering the surface of the copper foil 52b on the lower surface 51b of the film body 51 with a covering film 54, except for those portions of the copper foil 52b which are situated where the terminals are designed to protrude, solder bumps 53a, 53b are formed on those portions of the copper foils 52a, 52b on the upper and lower surfaces 51a and 51b of the film body 51 which are situated where the terminals protrude.

Figure 2B:
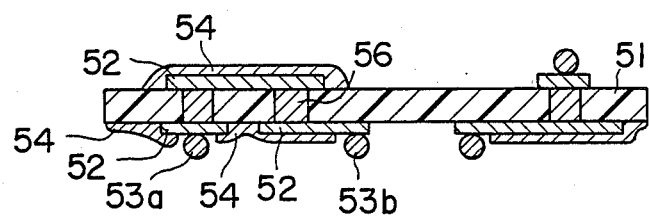
FIG. 2B is a sectional view showing a variation of the wiring film.

While in the above example solder bumps 53b and 53a are formed on different sides of the film body 51, they may alternatively be formed on the same side of the film body 51 if required, as shown in FIG. 2B.

Figure 3:
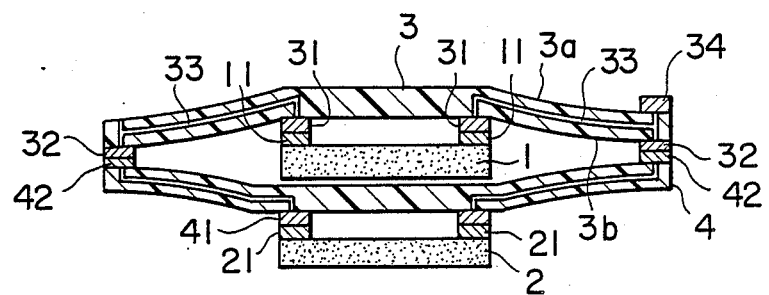
FIG. 3 is a sectional view showing a second embodiment of the invention.

FIG. 3 shows a second embodiment of this invention. In this embodiment, the first and second semiconductor chips 1 and 2 have electrode pads 11 and 21 for conducting the same signal. The second terminals 32 and 42 of the first and second wiring films 3 and 4, electrically connected to the electrode pads 11 and 21, are arranged in the same position and connected to each other. To facilitate the adhesion between the second terminals 32 and 42, the second terminals 32 of the first wiring film 3 are disposed on the lower surface 3b of the wiring film 3, and are directed downwardly. The second terminals 32 and 42 of the first and second wiring films 3 and 4 are adhered to each other by soldering or by means of a conductive adhesive. Furthermore, an external terminal 34 for both the first and second semiconductor chips 1 and 2 may be formed on the upper surface 3a of the first wiring film 3, etc., as needed, the external terminal 34 being connected to the second terminals 32 and 42 which are adhered to each other. Furthermore, when the first and second wiring films 3 and 4 are connected to each other through a number of second terminals 32 and 42, as in this embodiment, the lower surface 1b of the first semiconductor chip 1 does not have to be adhered to the upper surface 4a of the second wiring film 4 by means of an adhesive material.

Figure 4:
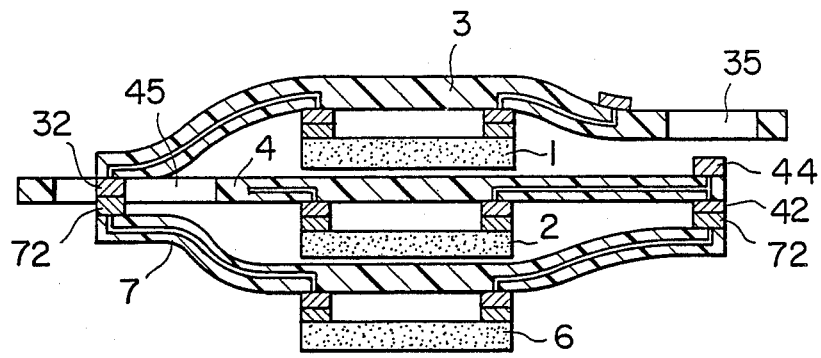
FIG. 4 is a sectional view showing a third embodiment of the invention.

FIG. 4 shows a third embodiment of this invention. In this embodiment, the number of semiconductor chips need not necessarily be limited to two. For example, the embodiment shown in FIG. 4 includes three semiconductor chips 1, 2 and 6 which are mounted on respective wiring films 3, 4 and 7, and are laminated on each other to form a multi-layer structure. In the embodiment shown, the second terminals 42 and 72 of the second and third wiring films 4 and 7 are connected to each other, an external terminal 44 for both the semiconductor chips 2 and 6 being formed thereon. If the first wiring film 3 is situated directly above the external terminal 44, an opening 35 may be provided in the first wiring film 3 at a position above the external terminal 44, the external terminal 44 being accessible through the opening 35. Likewise, if the second terminals 32 and 72 of the first and third wiring films 3 and 7 are connected to each other, an opening 45 may be provided in the second wiring film 4, the connection between the terminals 32 and 72 being effected through this opening 45.

Figure 5:
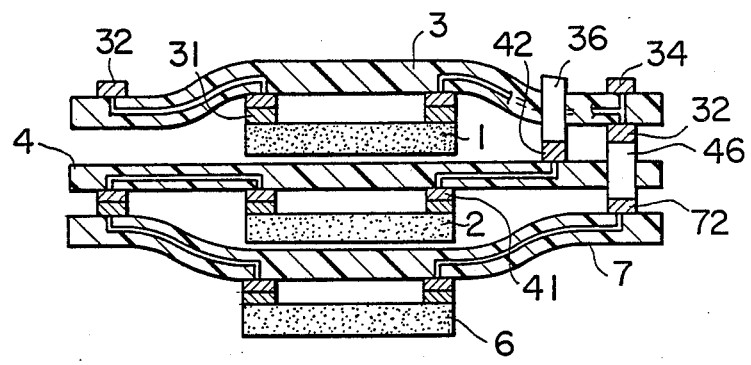
FIG. 5 is a sectional view showing a fourth embodiment of the invention.

FIG. 5 shows a fourth embodiment of this invention. In this embodiment, a connecting terminal 46, independent of the first and second terminals 41 and 42, is disposed in the second wiring film 4, and extends therethrough. The second terminals 32 of the first wiring film 3 and the second terminals 72 of the third wiring film 7 are connected to each other through this connecting terminal 46. Further, the first wiring film 3 also includes a connecting terminal 36 which extends therethrough, the second terminal 42 of the second wiring film 4 being connected to this connecting terminal 36 and accessible through this terminal.

Figure 6:
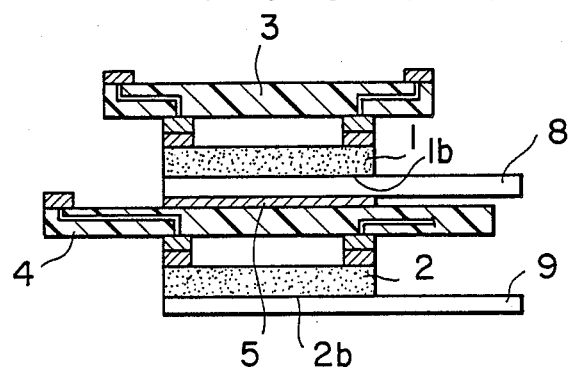
FIG. 6 is a sectional view showing a fifth embodiment of the invention.

FIG. 6 shows a fifth embodiment of this invention. In this embodiment, radiation plates 8 and 9 of a material having a high heat conductivity such as Cu or Al are adhered to the respective lower surfaces 1b and 2b of the semiconductor chips 1 and 2, the radiation plate 8 and the second wiring film 4 being connected to each other by means of an adhesive material 5. This arrangement helps to improve the thermal radiation properties of the semiconductor integrated circuit device. Furthermore, in a case where the radiation plates 8 and 9 are formed from an electrically conductive material, when the semiconductor chips 1 and 2 have electrodes on the respective lower surfaces 1b and 2b, electric potentials can be supplied to the semiconductor chips 1 and 2 through the radiation plates 8 and 9.

Figure 7:
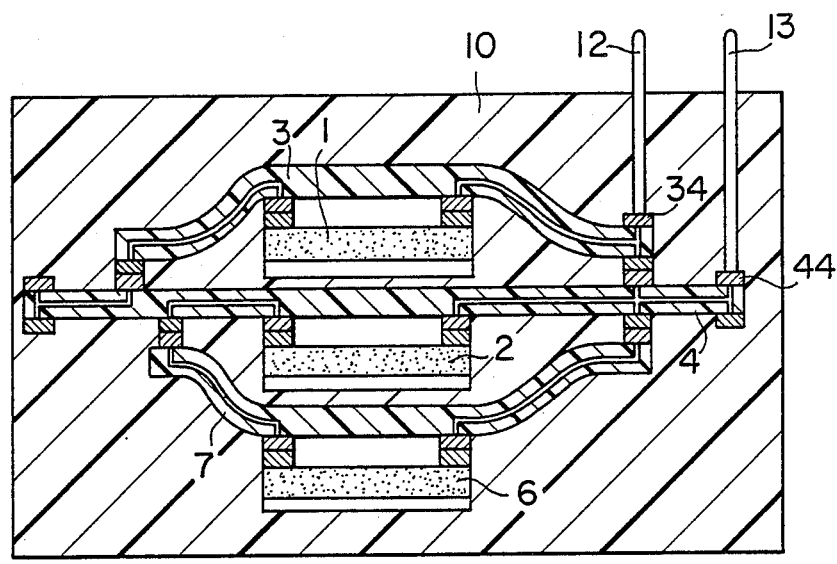
FIG. 7 is a sectional view showing a sixth embodiment of the invention.
Figure 8:
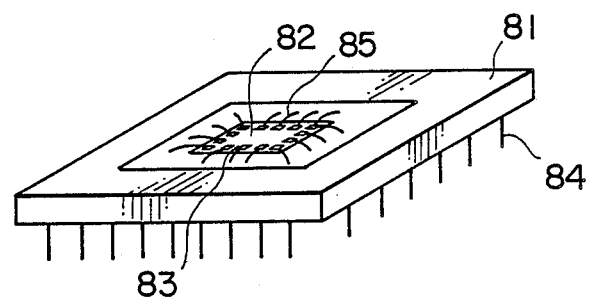
FIG. 8 is a perspective view of a conventional semiconductor device.

FIG. 7 shows a sixth embodiment of this invention. In this embodiment, the first, second and third semiconductor chips 1, 2 and 6, which are laminated to one another, are molded in a resin package 10. The first, second and third wiring films 3, 4 and 7, on which the respective semiconductor chips 1, 2 and 6 are mounted, are also molded in the resin package 10. Connected to the terminals 34 and 44 out are pins 12 and 13, respectively, the pins 12 and 13 extending outside of the resin package 10.

While in the above-described embodiments two or three semiconductor chips are laminated, it is also possible to laminate a greater number of semiconductor chips. Further, it is not necessary for the semiconductor chips to be directed in the same direction; some of the semiconductor chips may be directed in opposite directions. Furthermore, the electrode pads of the first and second semiconductor chips may be adhered to both sides of a single wiring film. The semiconductor chips used may be IC chips, LSI chips, etc.

What is claimed is:

1. A semiconductor integrated circuit device comprising:
   first and second semiconductor chips, each chip having opposed front and rear surfaces and a plurality of electrodes disposed on the front surface; and
   first and second wiring films, each wiring film having opposed front and rear sides, including a plurality of first and second terminals disposed on the front and rear sides, respectively, and wiring within each wiring film interconnecting respective first and second terminals, the second terminals of the first and second wiring films being disposed in correspondence with and attached to the electrodes of the first and second chips, respectively, wherein the first and second chips and the first and second wiring films are all disposed opposite each other, in a stack, one of (i) the first and second wiring films and (ii) the first wiring film and second chip being attached to each other.

2. The device of claim 1 wherein the first terminals on the first wiring film are disposed outwardly from the stack relative to the first terminals on the second wiring film.

3. The device of claim 1 wherein the first and second wiring films are attached to each other and at least one second terminal on the first wiring film is electrically connected to a corresponding second terminal on the second wiring film.

4. The device of claim 1 wherein the rear surface of the second chip is bonded to the front side of the first wiring film.

5. The device of claim 1 wherein the first and second wiring films are attached to each other and the second wiring film includes an opening providing access to a first terminal on the first wiring film.

6. The device of claim 1 including a third semiconductor chip having opposed front and rear surfaces and a plurality of electrodes disposed on the front surface of the third semiconductor chip, and a third wiring film having opposed front and rear sides including a plurality of first and second terminals disposed on the front and rear sides, respectively, and wiring within the third film interconnecting respective first and second terminals thereof, the second terminals of the third wiring film being disposed in correspondence with and attached to the electrodes of the third chip, wherein said third chip an third wiring film are disposed in the stack opposite the first and second chips, one of (i) the first and third wiring films and (ii) the third wiring film and first chip being attached to each other.

7. The device of claim 6 wherein the first wiring film is disposed between the second and third wiring films and the first wiring film includes an opening through which first terminals of the second and third wiring films are electrically connected to each other.

8. The device of claim 1 wherein the first and second chips and the first and second wiring films are disposed alternatingly as the first chip, the first wiring film, the second chip, and the second wiring film.

9. The device of claim 1 wherein the second terminals of the first and second wiring films are disposed in respective planes.

10. The device of claim 1 comprising connecting terminals extending through the first and second wiring films for providing electrical access to the first terminals on the first film at the front side of the second wiring film.

11. The device of claim 1 comprising first and second heat radiation plates extending from the stack, the first radiation plate being bonded to the rear surface of the second chip, the second radiation plate being bonded to the rear surface of the first chip.

12. The device of claim 11 wherein at least one of the first and second chips includes an electrode disposed on the rear surface of the semiconductor chip, the first and second radiation plates being electrically conductive and thereby providing electrical access to the respective electrodes on the rear side of at least one of said first and second semiconductor chips.

13. The device of claim 1 comprising a resin package molding the first and second semiconductor chips and the first and second wiring films.

14. The device of claim 13 comprising a plurality of pins, each of which is connected to a respective second terminal and extends from said resin package.

15. The device of claim 1 wherein each of said wiring films includes a film body polyimide.

16. The device of claim 11 wherein said radiation plates are Cu.

17. The device of claim 11 wherein said radiation plates are Al.

* * * * *